(12) United States Patent
Takenouchi

(10) Patent No.: US 10,872,819 B2
(45) Date of Patent: Dec. 22, 2020

(54) WORKPIECE PROCESSING METHOD

(71) Applicant: DISCO CORPORATION, Tokyo (JP)

(72) Inventor: Kenji Takenouchi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/937,402

(22) Filed: Mar. 27, 2018

(65) Prior Publication Data

US 2018/0286754 A1    Oct. 4, 2018

(30) Foreign Application Priority Data

Apr. 4, 2017  (JP) ................. 2017-074249

(51) Int. Cl.
| | |
|---|---|
| *H01L 21/48* | (2006.01) |
| *H01L 21/683* | (2006.01) |
| *H01L 21/78* | (2006.01) |
| *H01L 21/304* | (2006.01) |
| *H01L 21/268* | (2006.01) |
| *B28D 5/02* | (2006.01) |

(52) U.S. Cl.
CPC .............. *H01L 21/78* (2013.01); *B28D 5/022* (2013.01); *H01L 21/2686* (2013.01); *H01L 21/3043* (2013.01); *H01L 21/6836* (2013.01); *H01L 2221/6834* (2013.01); *H01L 2221/68327* (2013.01)

(58) Field of Classification Search
CPC ........... H01L 21/67092; H01L 21/3043; H01L 23/562
See application file for complete search history.

(56) References Cited

U.S. PATENT DOCUMENTS

| | | | |
|---|---|---|---|
| 5,461,008 | A | 10/1995 | Sutherland et al. |
| 5,904,548 | A | 5/1999 | Orcutt |

(Continued)

FOREIGN PATENT DOCUMENTS

| | | | |
|---|---|---|---|
| JP | 06349926 | A | 12/1994 |
| JP | 09055573 | A | 2/1997 |

(Continued)

OTHER PUBLICATIONS

Takenouchi, Kenji, U.S. Appl. No. 15/934,491, filed Mar. 23, 2018.
(Continued)

*Primary Examiner* — Bradley Smith
*Assistant Examiner* — David J Goodwin
(74) *Attorney, Agent, or Firm* — Greer Burns & Crain, Ltd.

(57) ABSTRACT

A processing method for processing a plate-shaped workpiece having a division line on the front side and a multilayer member containing metal formed on the back side is provided. The processing method includes a holding step of holding the front side of the workpiece on a holding table in the condition where the multilayer member formed on the back side of the workpiece is exposed, a cutting step of cutting the workpiece along the division line by using a cutting blade after performing the holding step, thereby forming a cut groove dividing the multilayer member, and a laser processing step of applying a laser beam to the workpiece along the cut groove after performing the cutting step. The cutting step includes the step of supplying a cutting fluid containing an organic acid and an oxidizing agent to the workpiece.

6 Claims, 6 Drawing Sheets

(56) References Cited

U.S. PATENT DOCUMENTS

| | | | |
|---|---|---|---|
| 6,280,298 B1 | 8/2001 | Gonzales | |
| 6,310,017 B1 | 10/2001 | Grant et al. | |
| 6,461,940 B1 | 10/2002 | Hasegawa et al. | |
| 6,791,197 B1 | 9/2004 | Katz | |
| 7,152,596 B1 | 12/2006 | Zhang | |
| 7,405,137 B2 | 7/2008 | Terayama et al. | |
| 8,557,682 B2* | 10/2013 | Holden | B23K 26/364 438/462 |
| 8,980,726 B2* | 3/2015 | Lei | H01L 21/78 438/462 |
| 9,130,057 B1* | 9/2015 | Kumar | B26D 9/00 |
| 9,165,832 B1* | 10/2015 | Papanu | H01L 21/78 |
| 9,349,647 B2* | 5/2016 | Takenouchi | H01L 21/78 |
| 9,728,412 B2 | 8/2017 | Alberti et al. | |
| 2003/0124771 A1* | 7/2003 | Maiz | H01L 21/3043 438/113 |
| 2004/0209443 A1 | 10/2004 | Cadieux et al. | |
| 2004/0212047 A1* | 10/2004 | Joshi | H01L 23/585 257/620 |
| 2005/0139962 A1* | 6/2005 | Dani | H01L 21/78 257/620 |
| 2006/0105546 A1* | 5/2006 | Genda | B81C 1/00888 438/463 |
| 2006/0223234 A1 | 10/2006 | Terayama et al. | |
| 2008/0191318 A1 | 8/2008 | Su et al. | |
| 2008/0277806 A1* | 11/2008 | Chen | B28D 5/022 257/618 |
| 2011/0048200 A1 | 3/2011 | Ide et al. | |
| 2012/0009762 A1* | 1/2012 | Tamboli | B28D 5/0076 438/460 |
| 2012/0286415 A1 | 11/2012 | Sakai et al. | |
| 2012/0329246 A1* | 12/2012 | Finn | H01L 21/78 438/462 |
| 2013/0203237 A1 | 8/2013 | Yamaguchi et al. | |
| 2013/0234193 A1 | 9/2013 | Odnoblyudov et al. | |
| 2013/0267076 A1 | 10/2013 | Lei et al. | |
| 2013/0337633 A1* | 12/2013 | Seddon | H01L 21/78 438/462 |
| 2014/0017882 A1 | 1/2014 | Lei et al. | |
| 2014/0154871 A1 | 6/2014 | Hwang et al. | |
| 2015/0040983 A1* | 2/2015 | Holdermann | H01L 31/068 136/261 |
| 2015/0262881 A1* | 9/2015 | Takenouchi | H01L 21/78 438/460 |
| 2015/0279739 A1* | 10/2015 | Lei | H01L 21/78 438/462 |
| 2016/0172202 A1 | 6/2016 | Alberti et al. | |
| 2017/0213757 A1 | 7/2017 | Nakamura et al. | |
| 2017/0368619 A1 | 12/2017 | Shimamura et al. | |
| 2018/0166328 A1 | 6/2018 | Tang et al. | |
| 2018/0286688 A1* | 10/2018 | Takenouchi | B23K 26/364 |

FOREIGN PATENT DOCUMENTS

| | | |
|---|---|---|
| JP | 2005021940 A | 1/2005 |
| WO | 2016114013 | 7/2016 |

OTHER PUBLICATIONS

Takenouchi, Kenji, U.S. Appl. No. 15/934,443, filed Mar. 23, 2018.
Takenouchi, Kenji, U.S. Appl. No. 15/936,622, filed Mar. 27, 2018.
Takenouchi, Kenji, U.S. Appl. No. 15/937,441, filed Mar. 27, 2018.
Takenouchi, Kenji, U.S. Appl. No. 15/938,832, filed Mar. 28, 2018.
Takenouchi, Kenji, U.S. Appl. No. 15/938,755, filed Mar. 28, 2018.
Takenouchi, Kenji, U.S. Appl. No. 15/940,468, filed Mar. 29, 2018.
Takenouchi, Kenji, U.S. Appl. No. 15/940,411, filed Mar. 29, 2018.
Takenouchi, Kenji, U.S. Appl. No. 15/941,131, filed Mar. 30, 2018.
Takenouchi, Kenji, U.S. Appl. No. 15/942,682, filed Apr. 2, 2018.

* cited by examiner

WORKPIECE PROCESSING METHOD

BACKGROUND OF THE INVENTION

Field of the Invention

The present invention relates to a processing method for processing a plate-shaped workpiece having a division line on the front side and a multilayer member containing metal formed on the back side.

Description of the Related Art

In electronic equipment typified by mobile phones and personal computers, a device chip including a device such as an electronic circuit is an essential component. The device chip may be obtained by preparing a wafer formed of a semiconductor such as silicon, next setting a plurality of crossing division lines (streets) on the front side of the wafer to define a plurality of separate regions, next forming a device in each separate region, and finally cutting the wafer along each division line.

In recent years, there has been increased a case that evaluation elements called TEG (Test Element Group) for evaluating the electrical characteristics of the devices are arranged on each division line of the wafer (see Japanese Patent Laid-open No. Hei 6-349926 and Japanese Patent Laid-open No. 2005-21940, for example). By arranging the TEG on each division line, the maximum number of device chips obtainable from the wafer can be ensured and the TEG that becomes unnecessary after evaluation can be removed simultaneously with the cutting of the wafer.

SUMMARY OF THE INVENTION

However, in the case of cutting and removing a multilayer member containing metal such as TEG on each division line by using a cutting blade formed by dispersing abrasive grains in a bond, the metal contained in the multilayer member may be elongated in cutting the wafer, causing a problem such that projections called burrs may be generated from the multilayer member. Further, when the processing speed by the cutting blade is increased, a processing heat generated is increased to result in enlargement of the burrs. Accordingly, the processing speed must be suppressed, so as to prevent a reduction in processing quality.

It is therefore an object of the present invention to provide a processing method which can increase the processing speed with the processing quality maintained in processing a plate-shaped workpiece having a division line on the front side and a multilayer member containing metal formed on the back side.

In accordance with an aspect of the present invention, there is provided a processing method for processing a plate-shaped workpiece having a division line on the front side and a multilayer member containing metal formed on the back side, the processing method including a holding step of holding the front side of the workpiece on a holding table in the condition where the multilayer member formed on the back side of the workpiece is exposed; a cutting step of cutting the workpiece along the division line by using a cutting blade after performing the holding step, thereby forming a cut groove dividing the multilayer member; and a laser processing step of applying a laser beam to the workpiece along the cut groove after performing the cutting step; the cutting step including the step of supplying a cutting fluid containing an organic acid and an oxidizing agent to the workpiece.

Preferably, the laser processing step includes the step of applying a laser beam having an absorption wavelength to the workpiece along the cut groove to thereby fully cut the workpiece along the cut groove.

Preferably, the laser processing step includes the step of applying a laser beam having a transmission wavelength to the workpiece along the cut groove to thereby form a modified layer inside the workpiece along the cut groove; the processing method further including a dividing step of dividing the workpiece along the modified layer after performing the laser processing step.

Preferably, the laser beam is applied to the back side of the workpiece in the laser processing step; the processing method further including a sheet attaching step of attaching a sheet to the front side of the workpiece before performing the laser processing step.

In the processing method according to the present invention, the cutting fluid containing an organic acid and an oxidizing agent is supplied to the workpiece in performing the cutting step of forming the cut groove dividing the multilayer member containing metal. Accordingly, the metal contained in the multilayer member can be modified by the organic acid and the oxidizing agent contained in the cutting fluid to thereby suppress the ductility of the metal in cutting the multilayer member. As a result, even when the processing speed in processing the workpiece is increased, the generation of burrs can be suppressed. In other words, the processing speed can be increased with the processing quality maintained.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will now be described with reference to the attached drawings. The processing method according to this preferred embodiment is a processing method for processing a plate-shaped workpiece having a division line on the front side and a multilayer member containing metal formed on the back side, in which this processing method includes a sheet attaching step (see FIG. 1B), a first holding step (see FIG. 2A), a cutting step (see FIG. 2B), a second holding step (see FIG. 3A), and a laser processing step (see FIG. 3B).

In the sheet attaching step, a sheet (protective member) is attached to the front side of the workpiece having the multilayer member on the back side. In the first holding step, the front side of the workpiece is held on a chuck table (first holding table) of a cutting apparatus in the condition where the multilayer member formed on the back side of the workpiece is exposed. In the cutting step, the workpiece is cut along the division line by using a cutting blade as supplying a cutting fluid containing an organic acid and an oxidizing agent to the workpiece, thereby forming a cut groove dividing the multilayer member. In the second holding step, the front side of the workpiece is held on a chuck table (second holding table) of a laser processing apparatus. In the laser processing step, a laser beam is applied to the back side of the workpiece along the division line (i.e., the cut groove previously formed) to thereby fully cut the workpiece along the division line. The processing method according to this preferred embodiment will now be described in more detail.

Figure 1A:
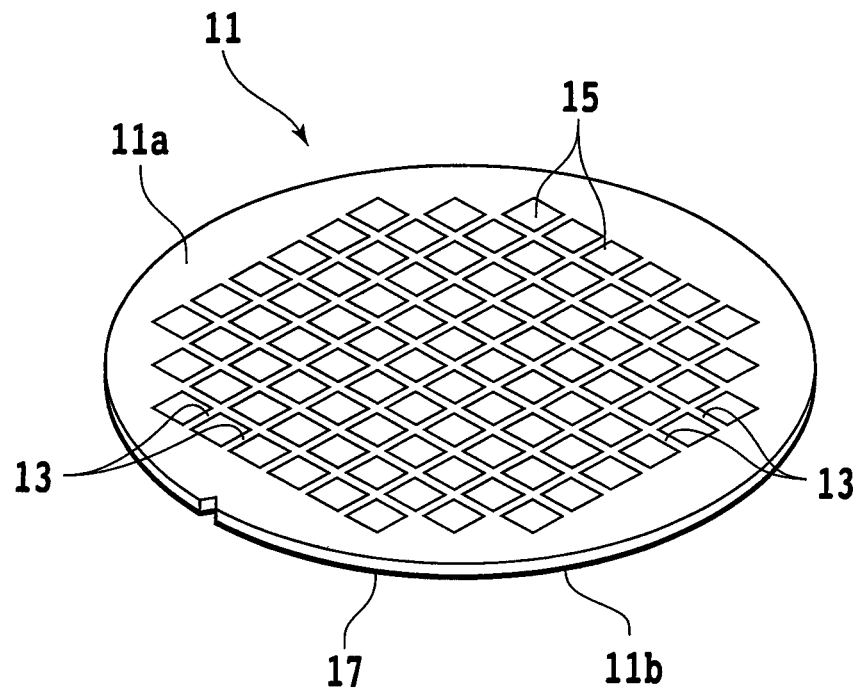
FIG. 1A is a schematic perspective view of a workpiece.

FIG. 1A is a schematic perspective view of a plate-shaped workpiece 11 to be processed by the processing method according to this preferred embodiment. As shown in FIG. 1A, the workpiece 11 has a front side 11a and a back side 11b. In this preferred embodiment, the workpiece 11 is a disk-shaped wafer formed of a semiconductor such as silicon (Si). The front side 11a of the workpiece 11 is composed of a central device area and a peripheral marginal area surrounding the device area.

The device area is partitioned by a plurality of crossing division lines (streets) 13 to thereby define a plurality of separate regions where a plurality of devices 15 such as ICs (Integrated Circuits) are formed. Furthermore, a multilayer member 17 is formed on the back side 11b of the workpiece 11, in which the multilayer member 17 contains metal. For example, the multilayer member 17 is a multilayer metal film formed of titanium (Ti), nickel (Ni), or gold (Au) and has a thickness of several micrometers. The multilayer member 17 functions as electrodes or the like. The multilayer member 17 is formed in the whole area of the back side 11b of the workpiece 11. That is, the multilayer member 17 is formed also in the area corresponding to each division line 13.

While the workpiece 11 is a disk-shaped wafer formed of a semiconductor such as silicon in this preferred embodiment, the workpiece 11 is not limited in material, shape, structure, size, etc. Similarly, the devices 15 and the multilayer member 17 are not limited in kind, number, shape, structure, size, layout, etc. For example, the workpiece 11 may be a package substrate having a structure such that the multilayer member 17 functions as electrodes, which are formed on each division line 13.

Figure 1B:
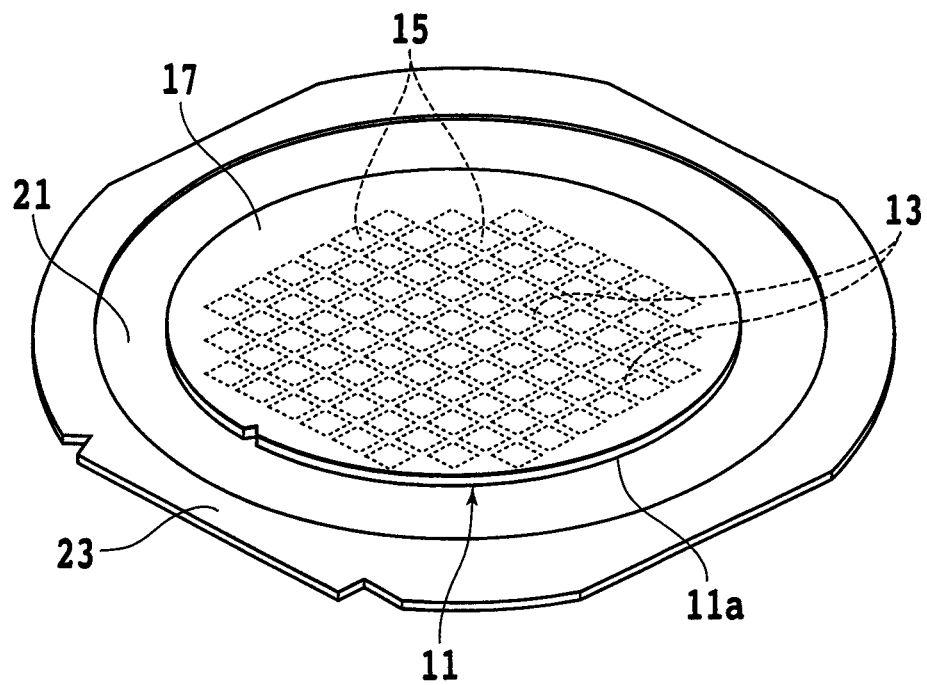
FIG. 1B is a perspective view for illustrating a sheet attaching step.

In the processing method according to this preferred embodiment, the sheet attaching step is first performed to attach a sheet (protective member) to the front side 11a of the workpiece 11. FIG. 1B is a perspective view for illustrating the sheet attaching step. As shown in FIG. 1B, the sheet attaching step is performed in such a manner that a circular resin sheet (protective member) 21 having a diameter larger than that of the workpiece 11 is attached to the front side 11a of the workpiece 11. That is, the sheet 21 is attached in its central portion to the front side 11a of the workpiece 11. Further, an annular frame 23 is fixed to the peripheral portion of the sheet 21.

Accordingly, the workpiece 11 is supported through the sheet 21 to the annular frame 23 in the condition where the multilayer member 17 formed on the back side 11b of the workpiece 11 is exposed. While the workpiece 11 is processed in the cutting step in the condition where it is supported through the sheet 21 to the annular frame 23 in this preferred embodiment, the workpiece 11 may be processed without using the sheet 21 and the annular frame 23. In this case, the sheet attaching step is omitted. Further, the resin sheet 21 may be replaced by any protective member such as a wafer similar to the workpiece 11 or a substrate.

Figure 2A:
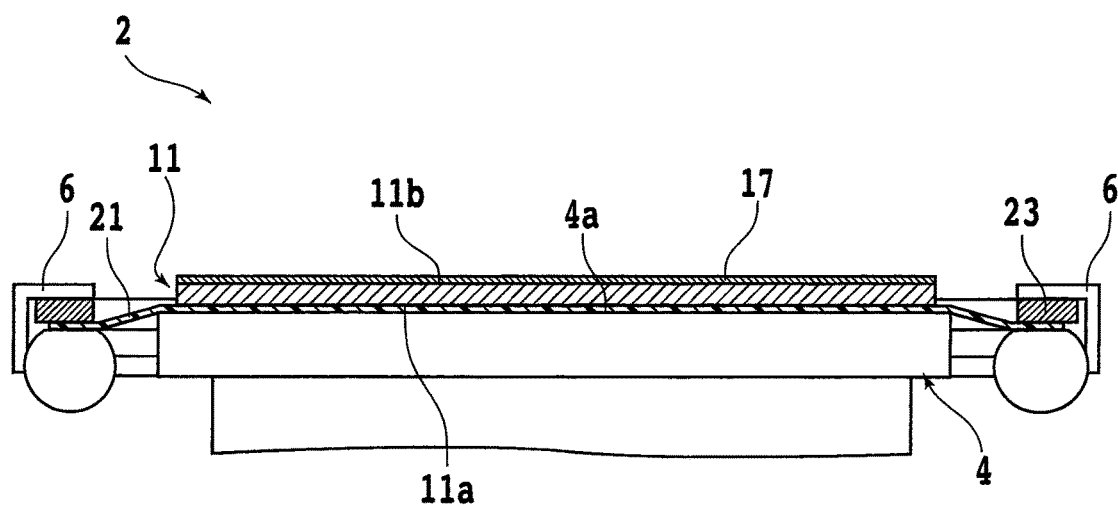
FIG. 2A is a partially sectional side view for illustrating a first holding step.

After performing the sheet attaching step, the first holding step is performed to hold the workpiece 11 on a chuck table (first holding table) of a cutting apparatus. FIG. 2A is a partially sectional side view for illustrating the first holding step. The first holding step may be performed by using a cutting apparatus 2 shown in FIG. 2A. The cutting apparatus 2 includes a chuck table (first holding table) 4 for holding the workpiece 11 under suction.

The chuck table 4 is connected to a rotational drive source (not shown) such as a motor. Accordingly, the chuck table 4 is adapted to be rotated about its axis substantially parallel to a vertical direction, by operating this rotational drive source. Further, a feeding mechanism (not shown) is provided below the chuck table 4, so as to move the chuck table 4 in a feeding direction (first horizontal direction).

The chuck table 4 has an upper surface, a part of which is formed as a holding surface 4a for holding the workpiece 11 (the sheet 21) under suction. The holding surface 4a is connected through a suction passage (not shown) to a vacuum source (not shown), in which the suction passage is formed inside the chuck table 4. Accordingly, by applying a vacuum generated from the vacuum source through the suction passage to the holding surface 4a, the workpiece 11 can be held on the chuck table 4 under suction. Further, a plurality of clamps 6 for fixing the annular frame 23 are provided on the outer circumference of the chuck table 4.

In the first holding step, the workpiece 11 supported through the sheet 21 to the annular frame 23 is placed on the holding surface 4a of the chuck table 4 in the condition where the sheet 21 attached to the front side 11a of the workpiece 11 is in contact with the holding surface 4a. That is, the multilayer member 17 formed on the back side 11b of the workpiece 11 is exposed in this condition. Thereafter, the vacuum source is operated to apply a vacuum to the holding surface 4a of the chuck table 4. Furthermore, the clamps 6 are operated to fix the annular frame 23. Accordingly, the workpiece 11 is held through the sheet 21 on the holding surface 4a of the chuck table 4 under suction in the condition where the multilayer member 17 formed on the back side 11b of the workpiece 11 is exposed upward.

Figure 2B:
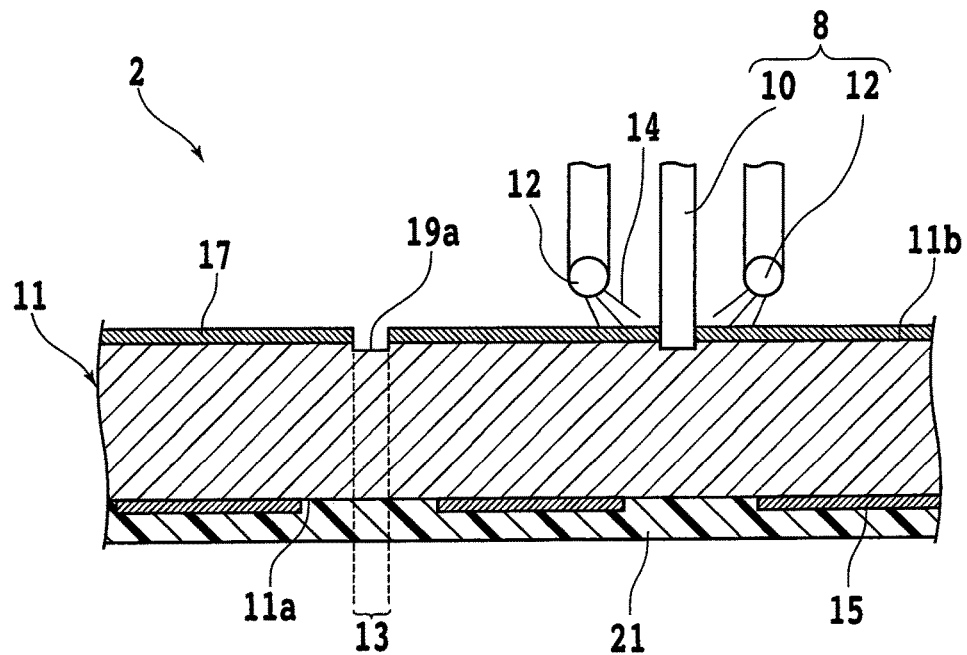
FIG. 2B is a partially sectional side view for illustrating a cutting step.

After performing the first holding step, the cutting step is performed to form a cut groove dividing the multilayer member 17. FIG. 2B is a partially sectional side view for illustrating the cutting step. The cutting step may be performed by using the cutting apparatus 2 used in the first holding step. As shown in FIG. 2B, the cutting apparatus 2 further includes a cutting unit 8 provided above the chuck table 4.

The cutting unit 8 includes a spindle (not shown) having a rotation axis substantially perpendicular to the feeding direction in a horizontal plane. An annular cutting blade 10 is mounted on the spindle at one end thereof. The cutting blade 10 is formed by dispersing abrasive grains in a bond. A rotational drive source (not shown) such as a motor is connected to the other end of the spindle. Accordingly, the cutting blade 10 mounted on one end of the spindle is rotated by a force applied from the rotational drive source to the spindle.

The spindle is supported to a moving mechanism (not shown). The cutting blade 10 is movable both in an indexing direction (second horizontal direction) perpendicular to the feeding direction and in a vertical direction, by operating this moving mechanism. A pair of nozzles 12 are provided on both sides of the cutting blade 10. That is, the cutting blade 10 is interposed between the pair of nozzles 12. Each nozzle 12 functions to supply a cutting fluid 14 containing an organic acid and an oxidizing agent to the cutting blade 10 and the workpiece 11.

In the cutting step, the chuck table 4 of the cutting apparatus 2 is rotated to align the direction of extension of a target one of the division lines 13 with the feeding direction of the cutting apparatus 2. Further, the chuck table 4 and the cutting unit 8 are relatively moved to position the cutting blade 10 directly above the extension of the target division line 13. Thereafter, the cutting blade 10 is lowered so that the lower end of the cutting blade 10 becomes lower in level than the lower surface of the multilayer member 17. By using a camera having sensitivity to infrared light, for example, the position of the target division line 13 can be recognized from the back side 11b of the workpiece 11.

Thereafter, the cutting blade 10 is rotated and the chuck table 4 is moved in the feeding direction. At the same time, the cutting fluid 14 containing an organic acid and an oxidizing agent is supplied from the nozzles 12 to the cutting blade 10 and the workpiece 11. Accordingly, the workpiece 11 is cut along the target division line 13 by the cutting blade 10 to thereby form a cut groove 19a dividing the multilayer member 17 along the target division line 13. That is, the cut groove 19a is formed along the target division line 13 so as to divide the multilayer member 17 formed on the back side 11b of the workpiece 11.

According to this preferred embodiment, the metal contained in the multilayer member 17 can be modified by the organic acid contained in the cutting fluid 14, thereby suppressing the ductility of the metal. Further, the surface of the metal contained in the multilayer member 17 can be easily oxidized by the oxidizing agent contained in the cutting fluid 14. As a result, the ductility of the metal contained in the multilayer member 17 can be sufficiently suppressed to thereby improve the workability.

As the organic acid contained in the cutting fluid 14, there can be used, for example, a compound that has at least one carboxyl group and at least one amino group in its molecule. In this case, it is preferable that at least one of the amino group(s) is a secondary or tertiary amino group. In addition, the compound used as the organic acid may have a substituent group.

As the organic acid, there can be used amino acids. Examples of the amino acids usable here include glycine, dihydroxyethylglycine, glycylglycine, hydroxyethylglycine, N-methylglycine, β-alanine, L-alanine, L-2-aminobutyric acid, L-norvaline, L-valine, L-leucine, L-norleucine, L-alloisoleucine, L-isoleucine, L-phenylalanine, L-proline, sarcosine, L-ornithine, L-lysine, taurine, L-serine, L-threonine, L-allothreonine, L-homoserine, L-thyroxine, L-tyrosine, 3,5-diiodo-L-tyrosine, β-(3,4-dihydroxyphenyl)-L-alanine, 4-hydroxy-L-proline, L-cysteine, L-methionine, L-ethionine, L-lanthionine, L-cystathionine, L-cystine, L-cystic acid, L-glutamic acid, L-aspartic acid, S-(carboxymethyl)-L-cysteine, 4-aminobutyric acid, L-asparagine, L-glutamine, azaserine, L-canavanine, L-citrulline, L-arginine, δ-hydroxy-L-lysine, creatine, L-kynurenine, L-histidine, 1-methyl-L-histidine, 3-methyl-L-histidine, L-tryptophane, actinomycin C1, ergothioneine, apamin, angiotensin I, angiotensin II, antipain, etc. Among others, particularly preferred are glycine, L-alanine, L-proline, L-histidine, L-lysine, and dihydroxyethylglycine.

Also, amino polyacids can be used as the organic acid. Examples of the amino polyacids usable here include iminodiacetic acid, nitrilotriacetic acid, diethylenetriaminepentaacetic acid, ethylenediaminetetraacetic acid, hydroxyethyliminodiacetic acid, nitrilotrismethylenephosphonic acid, ethylenediamine-N,N,N',N'-tetramethylenesulfonic acid, 1,2-diaminopropanetetraacetic acid, glycol ether diaminetetraacetic acid, transcyclohexanediaminetetraacetic acid, ethylenediamineorthohydroxyphenylacetic acid, ethylenediaminedisuccinic acid (SS isomer), β-alaninediacetic acid, N-(2-carboxylatoethyl)-L-aspartic acid, N,N'-bis(2-hydroxybenzyl)ethylenediamine-N,N'-diacetic acid, etc.

Further, carboxylic acids can be used as the organic acid. Examples of the carboxylic acids usable here include saturated carboxylic acids such as formic acid, glycolic acid, propionic acid, acetic acid, butyric acid, valeric acid, hexanoic acid, oxalic acid, malonic acid, glutaric acid, adipic acid, malic acid, succinic acid, pimelic acid, mercaptoacetic acid, glyoxylic acid, chloroacetic acid, pyruvic acid, acetoacetic acid, etc., unsaturated carboxylic acids such as acrylic acid, methacrylic acid, crotonic acid, fumaric acid, maleic acid, mesaconic acid, citraconic acid, aconitic acid, etc., and cyclic unsaturated carboxylic acids such as benzoic acids, toluic acid, phthalic acids, naphthoic acids, pyromellitic acid, naphthalic acid, etc.

As the oxidizing agent contained in the cutting fluid 14, there can be used, for example, hydrogen peroxide, peroxides, nitrates, iodates, periodates, hypochlorites, chlorites, chlorates, perchlorates, persulfates, dichromates, permanganates, cerates, vanadates, ozonated water, silver(II) salts, iron(III) salts, and their organic complex salts.

Besides, an anticorrosive may be mixed in the cutting fluid 14. Mixing of the anticorrosive makes it possible to prevent corrosion (elution) of the metal included in the workpiece 11. As the anticorrosive, there is preferably used a heterocyclic aromatic ring compound which has at least three nitrogen atoms in its molecule and has a fused ring structure or a heterocyclic aromatic ring compound which has at least four nitrogen atoms in its molecule. Further, the aromatic ring compound preferably includes a carboxyl group, sulfo group, hydroxyl group, or alkoxyl group. Specific preferable examples of the aromatic ring compound include tetrazole derivatives, 1,2,3-triazole derivatives, and 1,2,4-triazole derivatives.

Examples of the tetrazole derivatives usable as the anticorrosive include those which do not have a substituent group on the nitrogen atoms forming the tetrazole ring and which have, introduced into the 5-position of the tetrazole, a substituent group selected from the group consisting of sulfo group, amino group, carbamoyl group, carbonamide group, sulfamoyl group, and sulfonamide group, or an alkyl group substituted with at least one substituent group selected from the group consisting of hydroxyl group, carboxyl group, sulfo group, amino group, carbamoyl group, carbonamide group, sulfamoyl group, and sulfonamide group.

Examples of the 1,2,3-triazole derivatives usable as the anticorrosive include those which do not have a substituent group on the nitrogen atoms forming the 1,2,3-triazole ring and which have, introduced into the 4-position and/or 5-position of the 1,2,3-triazole, a substituent group selected from the group consisting of hydroxyl group, carboxyl group, sulfo group, amino group, carbamoyl group, carbonamide group, sulfamoyl group, and sulfonamide group, or an alkyl or aryl group substituted with at least one substituent group selected from the group consisting of hydroxyl group, carboxyl group, sulfo group, amino group, carbamoyl group, carbonamide group, sulfamoyl group, and sulfonamide group.

Besides, examples of the 1,2,4-triazole derivatives usable as the anticorrosive include those which do not have a substituent group on the nitrogen atoms forming the 1,2,4-triazole ring and which have, introduced into the 2-position and/or 5-position of 1,2,4-triazole, a substituent group selected from the group consisting of sulfo group, carbamoyl group, carbonamide group, sulfamoyl group, and sulfonamide group, or an alkyl or aryl group substituted with at least one substituent group selected from the group consisting of hydroxyl group, carboxyl group, sulfo group, amino group, carbamoyl group, carbonamide group, sulfamoyl group, and sulfonamide group.

The cutting operation along the target division line 13 is similarly performed along all of the other division lines 13 to form a similar cut groove 19a along each division line 13, thus finishing the cutting step. As described above, the cutting step is performed as supplying the cutting fluid 14 containing an organic acid and an oxidizing agent to the workpiece 11. Accordingly, the metal contained in each multilayer member 17 can be modified by the cutting fluid 14 to thereby suppress the ductility of the metal in cutting each multilayer member 17. As a result, even when the processing speed in processing the workpiece 11 is increased, the generation of burrs can be suppressed.

Figure 3A:
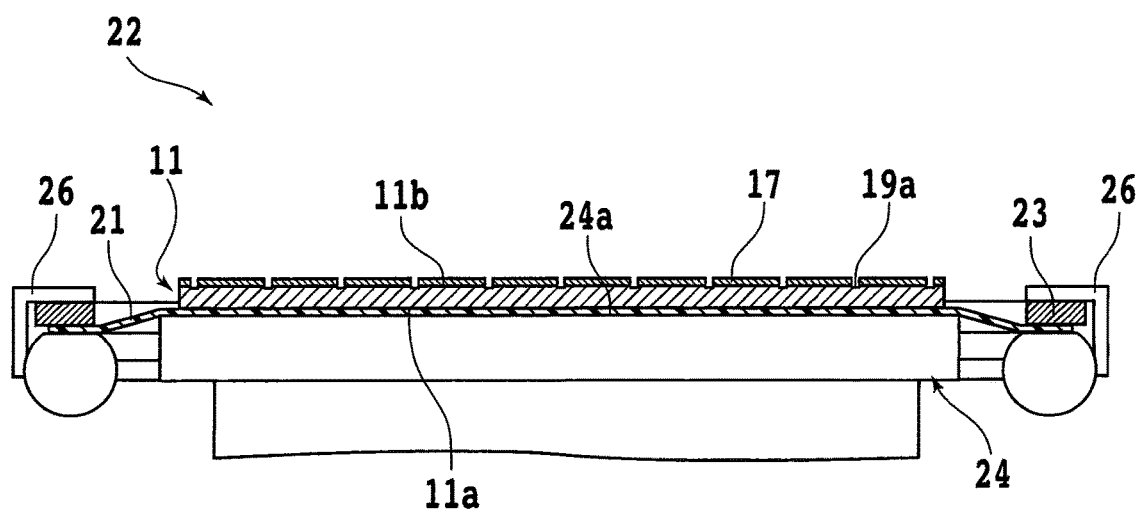
FIG. 3A is a partially sectional side view for illustrating a second holding step.

After performing the cutting step, the second holding step is performed to hold the workpiece 11 on a chuck table (second holding table) of a laser processing apparatus. FIG. 3A is a partially sectional side view for illustrating the second holding step. The second holding step may be performed by using a laser processing apparatus 22 shown in FIG. 3A. The laser processing apparatus 22 includes a chuck table (second holding table) 24 for holding the workpiece 11 under suction.

The chuck table 24 is connected to a rotational drive source (not shown) such as a motor. Accordingly, the chuck table 24 is adapted to be rotated about its axis substantially parallel to a vertical direction, by operating this rotational drive source. Further, a moving mechanism (not shown) is provided below the chuck table 24, so as to move the chuck table 24 both in a feeding direction (first horizontal direction) and in an indexing direction (second horizontal direction).

The chuck table 24 has an upper surface, a part of which is formed as a holding surface 24a for holding the workpiece 11 (the sheet 21) under suction. The holding surface 24a is connected through a suction passage (not shown) to a vacuum source (not shown), in which the suction passage is formed inside the chuck table 24. Accordingly, by applying a vacuum generated from the vacuum source through the suction passage to the holding surface 24a, the workpiece 11 can be held on the chuck table 24 under suction. Further, a plurality of clamps 26 for fixing the annular frame 23 are provided on the outer circumference of the chuck table 24.

In the second holding step, the workpiece 11 supported through the sheet 21 to the annular frame 23 is placed on the holding surface 24a of the chuck table 24 in the condition where the sheet 21 attached to the front side 11a of the workpiece 11 is in contact with the holding surface 24a. That is, the multilayer member 17 formed on the back side 11b of the workpiece 11 is exposed in this condition. Thereafter, the vacuum source is operated to apply a vacuum to the holding surface 24a of the chuck table 24. Furthermore, the clamps 26 are operated to fix the annular frame 23. Accordingly, the workpiece 11 is held through the sheet 21 on the holding surface 24a of the chuck table 24 under suction in the condition where the multilayer member 17 formed on the back side 11b of the workpiece 11 is exposed upward, i.e., the bottom of each cut groove 19a is exposed upward.

Figure 3B:
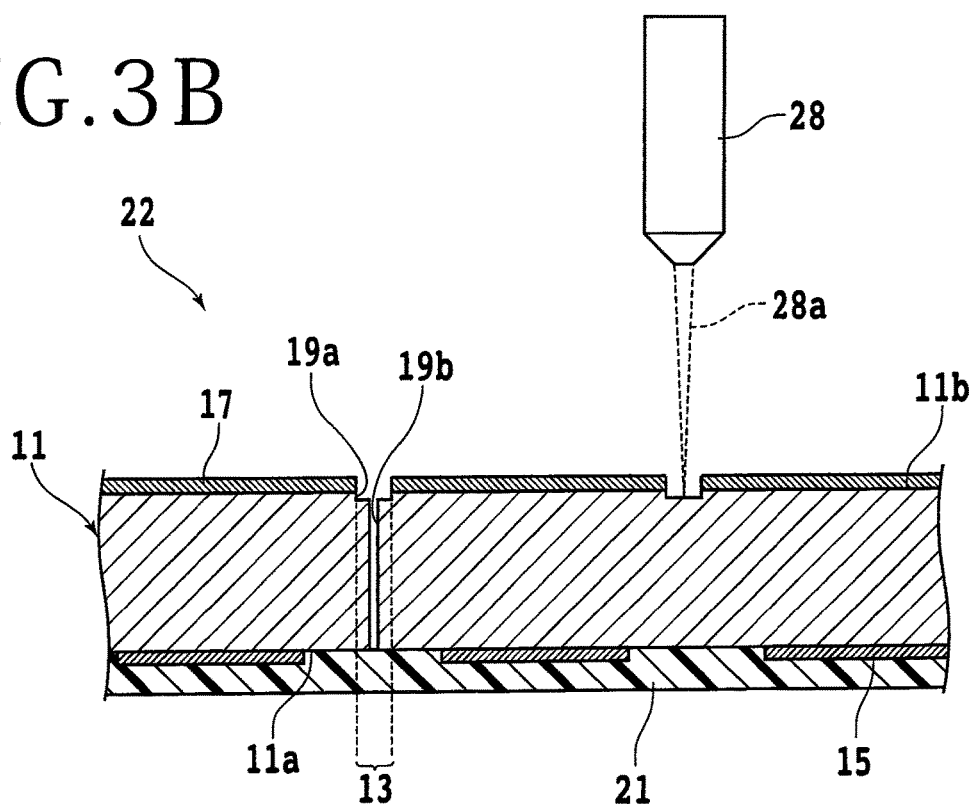
FIG. 3B is a partially sectional side view for illustrating a laser processing step.

After performing the second holding step, the laser processing step is performed to apply a laser beam to the bottom of each cut groove 19a on the back side 11b of the workpiece 11, thereby fully cutting the workpiece 11 along each division line 13, i.e., along each cut groove 19a. The laser processing step may be performed by using the laser processing apparatus 22 used in the second holding step. FIG. 3B is a partially sectional side view for illustrating the laser processing step. As shown in FIG. 3B, the laser processing apparatus 22 further includes a laser applying unit 28 provided above the chuck table 24.

The laser applying unit 28 functions to apply and focus a pulsed laser beam 28a to a predetermined position, in which the pulsed laser beam 28a is previously oscillated from a laser oscillator (not shown). The laser oscillator is so configured as to oscillate the pulsed laser beam 28a having an absorption wavelength to the workpiece 11 (i.e., a wavelength absorbable by the workpiece 11, or a wavelength easy to absorb to the workpiece 11).

In the laser processing step, the chuck table 24 of the laser processing apparatus 22 is rotated to align the direction of extension of a target one of the cut grooves 19a (i.e., the division lines 13) with the feeding direction of the laser processing apparatus 22. Further, the chuck table 24 is moved to position the laser applying unit 28 directly above the extension of the target cut groove 19a.

Thereafter, as shown in FIG. 3B, the laser beam 28a is applied from the laser applying unit 28 to the bottom of the target cut groove 19a on the back side 11b of the workpiece 11, and at the same time the chuck table 24 is moved in the feeding direction. In this preferred embodiment, the laser beam 28a is focused on the bottom of the target cut groove 19a, on the front side 11a of the workpiece 11, or inside the workpiece 11.

Accordingly, the laser beam 28a can be applied along the target cut groove 19a to thereby form a kerf (slit) 19b fully cutting the workpiece 11. That is, the kerf 19b has a depth reaching the front side 11a of the workpiece 11. The laser processing operation along the target cut groove 19a is similarly performed along all of the other cut grooves 19a to form a similar kerf 19b along each cut groove 19a. As a result, the workpiece 11 is divided into a plurality of chips, thus finishing the laser processing step.

In the processing method according to this preferred embodiment described above, the cutting fluid 14 containing an organic acid and an oxidizing agent is supplied to the workpiece 11 in performing the cutting step of forming each cut groove 19a dividing the multilayer member 17 containing metal. Accordingly, the metal contained in the multilayer member 17 can be modified by the organic acid and the oxidizing agent contained in the cutting fluid 14 to thereby suppress the ductility of the metal in cutting the multilayer member 17. As a result, even when the processing speed in processing the workpiece 11 is increased, the generation of burrs can be suppressed. In other words, the processing speed can be increased with the processing quality maintained.

The present invention is not limited to the above preferred embodiment, but various modifications may be made. For example, while the laser processing step in the above preferred embodiment is realized by performing ablation using the laser beam 28a having an absorption wavelength to the workpiece 11 to thereby cut (divide) the workpiece 11, any other methods may be adopted to process the workpiece 11.

Figure 4:
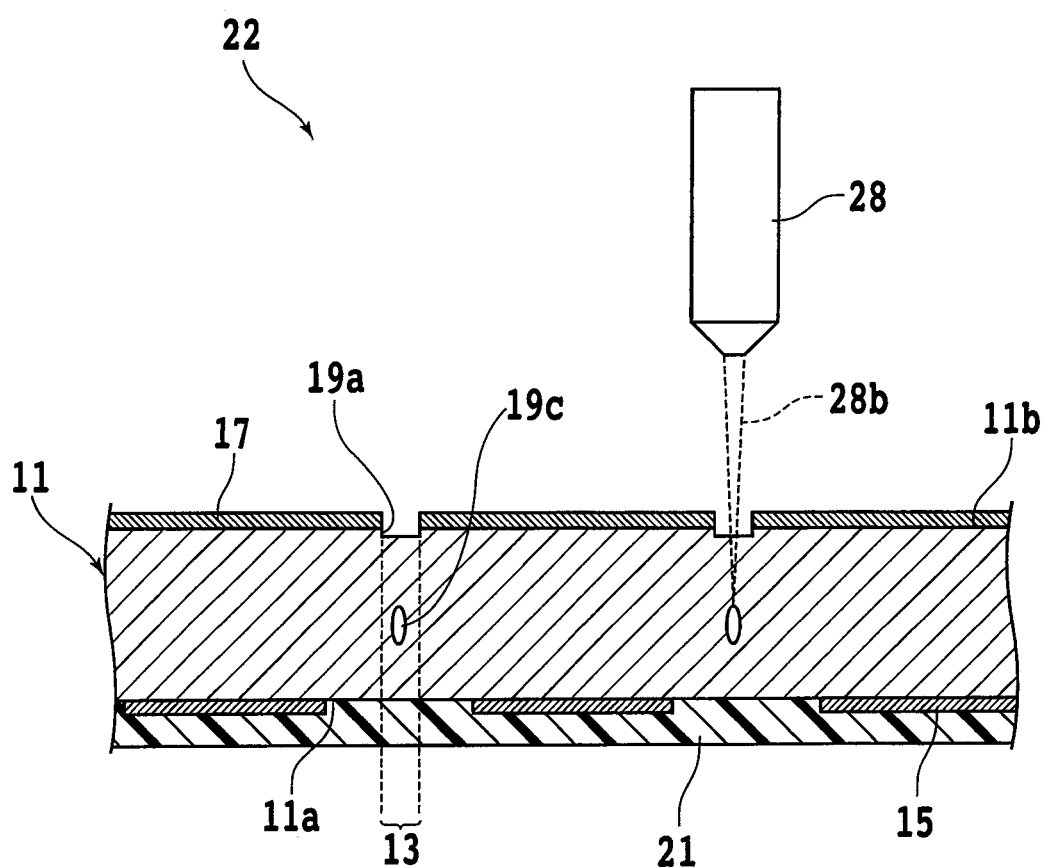
FIG. 4 is a partially sectional side view for illustrating a modification of the laser processing step.

FIG. 4 is a partially sectional side view for illustrating a modification of the laser processing step. As shown in FIG. 4, the laser processing step according to the modification is performed by using a laser processing apparatus 22 similar to that used in the above preferred embodiment. The laser processing apparatus 22 shown in FIG. 4 includes a laser applying unit 28 for applying a pulsed laser beam 28b having a transmission wavelength to the workpiece 11 (i.e., a wavelength transmittable through the workpiece 11, or a wavelength hard to absorb to the workpiece 11). The pulsed laser beam 28b is applied and focused to a predetermined position.

In the laser processing step according to this modification, the chuck table 24 is rotated to align the direction of extension of a target one of the cut grooves 19a (i.e., the division lines 13) with the feeding direction of the laser processing apparatus 22. Further, the chuck table 24 is moved to position the laser applying unit 28 directly above the extension of the target cut groove 19a.

Thereafter, as shown in FIG. 4, the laser beam 28b is applied from the laser applying unit 28 to the bottom of the target cut groove 19a on the back side 11b of the workpiece 11, and at the same time the chuck table 24 is moved in the feeding direction. In this modification, the laser beam 28b is focused inside the workpiece 11 at a given depth from the bottom of the target cut groove 19a on the back side 11b of the workpiece 11.

Accordingly, the laser beam 28b having a transmission wavelength to the workpiece 11 can be applied along the target cut groove 19a to thereby modify the inside of the workpiece 11 by multiphoton absorption. As a result, a modified layer 19c is formed as a division start point inside the workpiece 11 at a given depth along the target cut groove 19a as shown in FIG. 4.

The laser processing operation along the target cut groove 19a is similarly performed along all of the other cut grooves 19a, i.e., all of the other division lines 13 to form a similar modified layer 19c along each cut groove 19a, thus finishing the laser processing step according to this modification. The modified layer 19c may be formed under such conditions that a crack is formed between the modified layer 19c and the bottom of each cut groove 19a or between the modified layer 19c and the front side 11a of the workpiece 11. Further, a plurality of modified layers 19c may be formed at different depths along each division line 13.

Figure 5A:
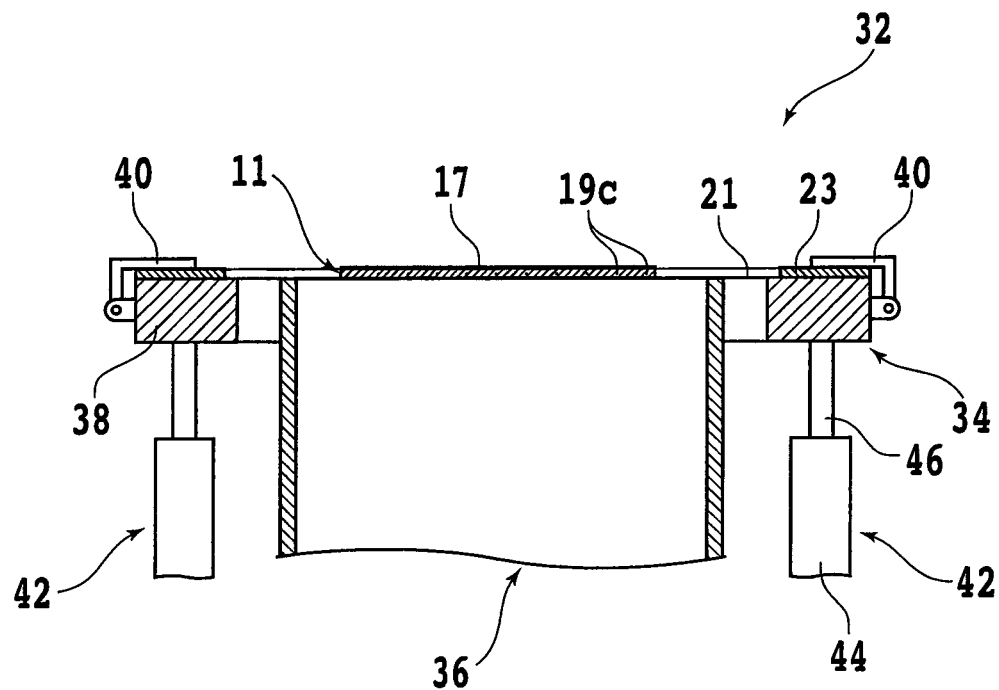
FIGS. 5A and 5B are partially sectional side views for illustrating a dividing step.
Figure 5B:
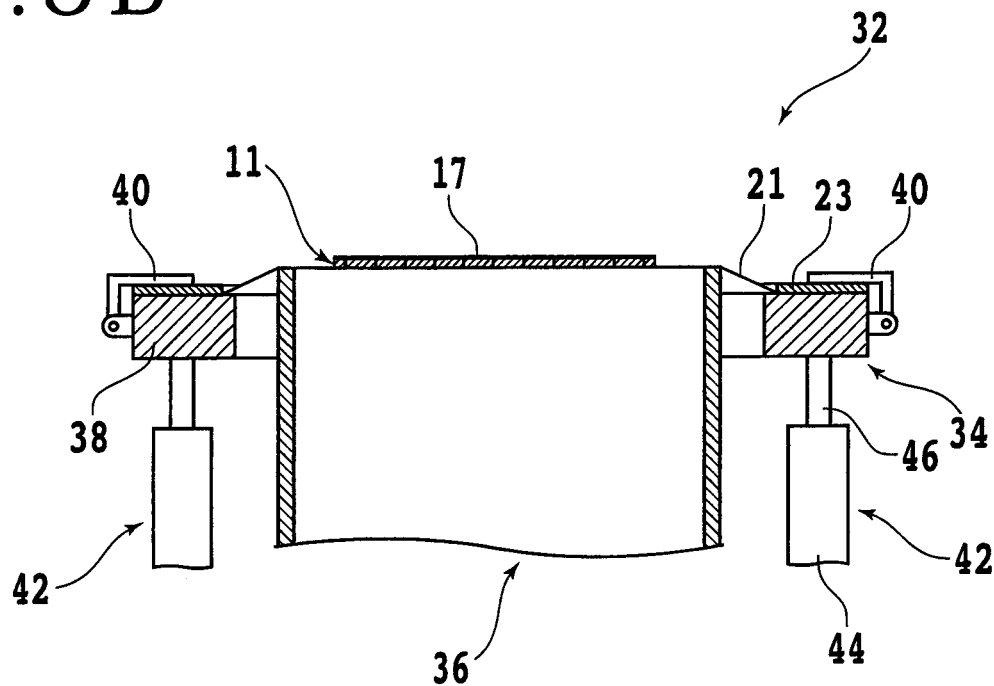

After performing the laser processing step according to this modification, a dividing step is preferably performed to divide the workpiece 11 along each modified layer 19c. FIGS. 5A and 5B are partially sectional side views for illustrating the dividing step. The dividing step may be performed by using an expanding apparatus 32 shown in FIGS. 5A and 5B. As shown in FIGS. 5A and 5B, the expanding apparatus 32 includes a support structure 34 for supporting the workpiece 11 and a cylindrical expanding drum 36.

The support structure 34 includes an annular support table 38 having a circular opening as viewed in plan. The support table 38 has an upper surface for mounting the annular frame 23. A plurality of clamps 40 for fixing the annular frame 23 are provided on the outer circumference of the support table 38. The support table 38 is supported by a plurality of vertically moving mechanisms 42 such as air cylinders for vertically moving the support structure 34.

Each vertically moving mechanism 42 includes a cylinder case 44 fixed at its lower end to a base (not shown) and a piston rod 46 operatively inserted in the cylinder case 44. The support table 38 is fixed to the upper end of each piston rod 46. Accordingly, by operating each vertically moving mechanism 42 to vertically move each piston rod 46, the support structure 34 can be vertically moved.

The expanding drum 36 is provided in the opening of the support table 38. The expanding drum 36 has an inner diameter larger than the diameter of the workpiece 11 and has an outer diameter smaller than the inner diameter of the annular frame 23 and also smaller than the inner diameter of the support table 38, i.e., the diameter of the opening of the support table 38.

In the dividing step, the height of the upper surface of the support table 38 is set equal to the height of the upper end of the expanding drum 36 as shown in FIG. 5A. In this condition, the annular frame 23 is mounted through the sheet 21 on the upper surface of the support table 38 and is then fixed by the clamps 40 as shown in FIG. 5A. Accordingly, the upper end of the expanding drum 36 comes into contact with the sheet 21 in an annular area between the workpiece 11 and the annular frame 23.

Thereafter, as shown in FIG. 5B, the vertically moving mechanisms 42 are operated to lower the support structure 34. Accordingly, the height of the upper surface of the support table 38 becomes lower than the height of the upper end of the expanding drum 36. As a result, the expanding drum 36 is relatively raised from the support table 38, so that the sheet 21 having stretchability is pushed up by the expanding drum 36 and accordingly expanded radially. When the sheet 21 is expanded radially, a force (radial force) having a direction of expanding the sheet 21 is applied to the workpiece 11. Accordingly, the workpiece 11 is divided along each modified layer 19c as a division start point to obtain a plurality of chips.

While the sheet attaching step is performed before performing the first holding step in the above preferred embodiment, the sheet attaching step may be performed before performing the second holding step (before performing the laser processing step).

Further, while the laser beam is applied to the back side 11b of the workpiece 11 in the laser processing step according to the above preferred embodiment and the modification, the laser beam may be applied to the front side 11a of the workpiece 11. In this case, the back side 11b of the workpiece 11 is held on the chuck table 24 in the second holding step. Accordingly, before performing the second holding step, it is preferable to peel the sheet 21 from the front side 11a of the workpiece 11 and next attach another sheet (protective member) to the back side 11b (the multilayer member 17) of the workpiece 11.

Figure 6:
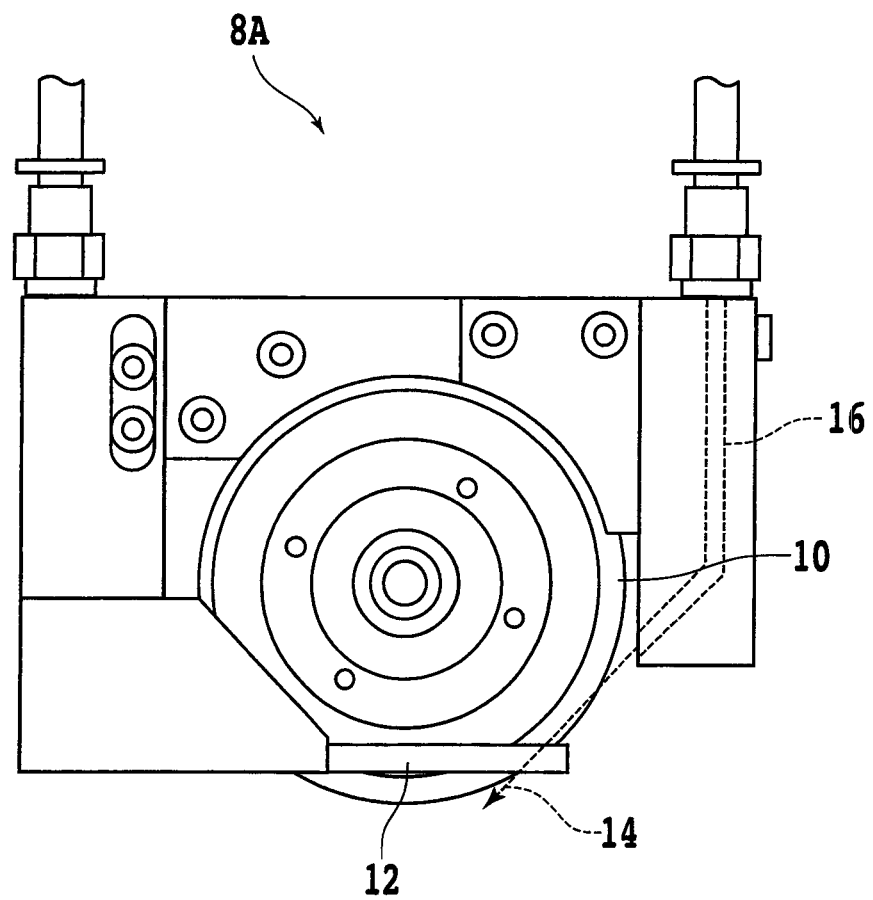
FIG. 6 is a side view showing nozzle means for supplying a cutting fluid in the cutting step according to a modification.

Further, while the cutting fluid 14 is supplied from the pair of nozzles 12 located on both sides of the cutting blade 10 in the cutting step, any nozzle means capable of supplying the cutting fluid 14 may be adopted in the present invention. FIG. 6 is a side view of a cutting unit 8A including such nozzle means capable of supplying the cutting fluid 14 according to a modification. As shown in FIG. 6, the cutting unit 8A includes a nozzle (shower nozzle) 16 for supplying the cutting fluid 14, in addition to the cutting blade 10 and the pair of nozzles 12. The nozzle 16 is located on the front side (or the rear side) of the cutting blade 10 in its cutting direction (feeding direction).

By supplying the cutting fluid 14 from the nozzle 16, the cutting fluid 14 can be easily supplied to each cut groove 19a, so that the metal contained in the multilayer member 17 can be modified effectively by the cutting fluid 14. In particular, the nozzle opening of the nozzle 16 is preferably directed obliquely downward (e.g., toward the work position where the cutting blade 10 cuts the workpiece) as shown in FIG. 6. With this configuration, the cutting fluid 14 can be more supplied to each cut groove 19a, so that the metal contained in the multilayer member 17 can be modified more effectively by the cutting fluid 14. While the pair of nozzles 12 and the nozzle 16 are used to supply the cutting fluid 14 in the modification shown in FIG. 6, only the nozzle 16 may be used to supply the cutting fluid 14.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method for processing a plate-shaped workpiece having a division line on a front side and a multilayer member containing metal formed on a back side, wherein the front side includes a plurality of devices thereon, said processing method comprising:
    a holding step of holding the front side of said plate-shaped workpiece on a holding table in a condition where said multilayer member formed on the back side of said plate-shaped workpiece is exposed;
    a cutting step of cutting said plate-shaped workpiece along said division line by using a cutting blade after performing said holding step, thereby forming a cut groove dividing said multilayer member, with a remainder portion of said plate-shaped workpiece remaining below a base of the cut groove; and
    a laser processing step of applying a laser beam to said plate-shaped workpiece along said cut groove after performing said cutting step, wherein the laser beam passes through said cut groove before passing into said plate-shaped workpiece, wherein said laser beam is applied to the back side of said plate-shaped workpiece in said laser processing step;
    said cutting step including supplying a cutting fluid containing an organic acid and an oxidizing agent to said plate-shaped workpiece, and
    wherein the base of said cut groove formed during said cutting step is slightly lower in level than a lower surface of the multilayer member, such that a depth of said cut groove is less than a thickness of the remainder portion of said plate-shaped workpiece remaining below the base of the cut groove, and
    wherein said laser processing step includes applying a laser beam having a wavelength capable of being transmitted through said plate-shaped workpiece along said cut groove to thereby form a modified layer inside said plate-shaped workpiece along said cut groove;
    said processing method further comprising a dividing step of dividing said plate-shaped workpiece along said modified layer after performing said laser processing step.

2. A processing method for processing a plate-shaped workpiece having a division line on a front side and a multilayer member containing metal formed on a back side, wherein the front side includes a plurality of devices thereon, said processing method comprising:
    a holding step of holding the front side of said plate-shaped workpiece on a holding table in a condition where said multilayer member formed on the back side of said plate-shaped workpiece is exposed;
    a cutting step of cutting said plate-shaped workpiece along said division line by using a cutting blade after performing said holding step, thereby forming a cut groove dividing said multilayer member, with a remainder portion of said plate-shaped workpiece remaining below a base of the cut groove; and
    a laser processing step of applying a laser beam to said plate-shaped workpiece along said cut groove after performing said cutting step, wherein the laser beam passes through said cut groove before passing into said plate-shaped workpiece, wherein said laser beam is applied to the back side of said plate-shaped workpiece in said laser processing step;
    said cutting step including supplying a cutting fluid containing an organic acid and an oxidizing agent to said plate-shaped workpiece, and
    wherein the base of said cut groove formed during said cutting step is slightly lower in level than a lower surface of the multilayer member, such that a depth of said cut groove is less than a thickness of the remainder portion of said plate-shaped workpiece remaining below the base of the cut groove, and
    wherein said laser beam applied during said laser processing step has a wavelength capable of being absorbed by said plate-shaped workpiece along said cut groove to thereby fully cut said plate-shaped workpiece along said cut groove.

3. The processing method according to claim 1, said processing method further comprising a sheet attaching step of attaching a sheet to the front side of said plate-shaped workpiece before performing said laser processing step.

4. The processing method according to claim 1, further comprising a sheet attaching step of attaching a protective member to the front side of said plate-shaped workpiece, wherein the sheet attaching step is performed before the holding step.

5. The processing method according to claim 1, wherein said devices each comprise an integrated circuit.

6. The processing method according to claim 1, wherein said multilayer member is formed on the entire back side of the plate-shaped workpiece.

* * * * *